US012677400B2

(12) United States Patent
Watanabe et al.

(10) Patent No.: US 12,677,400 B2
(45) Date of Patent: Jul. 7, 2026

(54) IN-VEHICLE DEVICE

(71) Applicant: Hitachi Astemo, Ltd., Hitachinaka (JP)

(72) Inventors: Kimihito Watanabe, Hitachinaka (JP); Naoki Hoshiya, Hitachinaka (JP)

(73) Assignee: Hitachi Astemo, Ltd., Ibaraki (JP)

( * ) Notice: Subject to any disclaimer, the term of this patent is extended or adjusted under 35 U.S.C. 154(b) by 211 days.

(21) Appl. No.: 18/281,351

(22) PCT Filed: Feb. 2, 2022

(86) PCT No.: PCT/JP2022/004081
§ 371 (c)(1),
(2) Date: Sep. 11, 2023

(87) PCT Pub. No.: WO2022/224537
PCT Pub. Date: Oct. 27, 2022

(65) Prior Publication Data
US 2024/0164066 A1 May 16, 2024

(30) Foreign Application Priority Data

Apr. 20, 2021 (JP) ................................. 2021-071112

(51) Int. Cl.
*H05K 7/20* (2006.01)

(52) U.S. Cl.
CPC ............................... *H05K 7/20854* (2013.01)

(58) Field of Classification Search
CPC ............................ H05K 7/20854; H01L 23/42
See application file for complete search history.

(56) References Cited

U.S. PATENT DOCUMENTS 6,281,573 B1* 8/2001 Atwood ............. H01L 23/3675
257/710
6,752,204 B2* 6/2004 Dishongh ............... F28F 13/00
165/185

(Continued)

FOREIGN PATENT DOCUMENTS

JP 2007-234781 A 9/2007
JP 2007258430 A * 10/2007

(Continued)

OTHER PUBLICATIONS

International Search Report, PCT/JP2022/004081, May 10, 2022.

(Continued)

*Primary Examiner* — Mukundbhai G Patel
(74) *Attorney, Agent, or Firm* — Volpe Koenig

(57) ABSTRACT

An in-vehicle device includes a circuit board on which a heat generating component (electronic component) is mounted, a first housing (base member) that faces the heat generating component, and a thermal conductive material that fills a space between the heat generating component and the first housing. The first housing includes a first surrounding portion and a second surrounding portion. The first surrounding portion is formed inside a region of the first housing that overlaps with the heat generating component while having the thermal conductive material interposed therebetween, and surrounds a point in the region of the first housing that faces the center of the heat generating component. The second surrounding portion is formed outside the region of the first housing, and surrounds the first surrounding portion.

18 Claims, 4 Drawing Sheets

(56) References Cited

U.S. PATENT DOCUMENTS

| 7,006,353 B2* | 2/2006 | Matteson | ................ H01L 24/73 |
| | | | 174/16.3 |
| 2001/0026957 A1 | 10/2001 | Atwood et al. | |
| 2007/0200209 A1 | 8/2007 | Fukuzono | |
| 2013/0134574 A1 | 5/2013 | Ihara | |

FOREIGN PATENT DOCUMENTS

| JP | 2013-115083 A | | 6/2013 |
| JP | 2015088629 A | * | 5/2015 |
| JP | 2018-198335 A | | 12/2018 |

OTHER PUBLICATIONS

Notification of Transmittal of Translation of the International Preliminary Report on Patentability issued on Nov. 2, 2023 for PCT International Application No. PCT/JP2022/004081.

* cited by examiner (EXAMPLE ACCORDING TO RELATED ART)

(EXAMPLE ACCORDING TO RELATED ART)

IN-VEHICLE DEVICE

TECHNICAL FIELD

The present invention relates to an in-vehicle device.

BACKGROUND ART

Since many heat-generating electronic components such as arithmetic processing devices and semiconductor elements are mounted on a board in a housing of an in-vehicle device mounted on a vehicle, such as automated driving control devices and advanced driving assistance control devices, an internal temperature of the housing tends to rise.

Therefore, a heat dissipation structure has been developed in which heat generated by an electronic component is transferred to a housing of a device and released from a surface of the housing to the outside of the housing.

For example, a thermal conductive material is interposed between an electronic component mounted on a circuit board and a housing, and heat generated from the electronic component is transferred to the housing via the thermal conductive material and dissipated from a surface of the housing to the outside of the housing (see, for example, PTL 1). Heat dissipation grease is used as the thermal conductive material.

CITATION LIST

Patent Literature

PTL 1: JP 2018-198335 A

SUMMARY OF INVENTION

Technical Problem

However, in a case where the heat dissipation grease is used, there is a problem as described below. Generally, a thermal conductive material such as alumina is mixed in the heat dissipation grease in order to increase thermal conductivity, and thus, the heat dissipation grease has a high initial viscosity, and in a case where the heat dissipation grease is discharged from a nozzle by an air pressure or the like and applied, it is difficult to smoothly discharge the heat dissipation grease from the nozzle, and clogging of the nozzle easily occurs. Therefore, it is not suitable for coating work using a coating robot or the like.

Therefore, a method is also adopted in which a pipe is provided at a pail can (for example, a can containing 20 kg) containing the heat dissipation grease, a nozzle is connected to the pail can, and the heat dissipation grease in the can is discharged from the nozzle and applied. However, even in this case, it is not easy to discharge the heat dissipation grease even if an air pressure is increased because a thin and long pipe must be used as the pipe.

As described in the above problems, it is difficult to keep an application position and an application amount of the heat dissipation grease constant, and a method of increasing the application amount of the heat dissipation grease has been used so far in order to absorb the variation. However, the excessive application of the heat dissipation grease overflows from between the electronic component and the housing as illustrated in FIG. 3, and the heat dissipation grease that does not contribute to thermal conduction is applied, which leads to an increase in product cost.

An object of the present invention is to provide an in-vehicle device capable of suppressing outflow of a thermal conductive material while aligning a center of a crushed shape of the thermal conductive material with a center of a heat generating component.

Solution to Problem

In order to achieve the above object, the present invention includes: a circuit board on which a heat generating component is mounted; a first housing that faces the heat generating component; and a thermal conductive material that fills a space between the heat generating component and the first housing, in which the first housing includes a first surrounding portion that is formed inside a region of the first housing that overlaps with the heat generating component while having the thermal conductive material interposed therebetween and surrounds a point in the region of the first housing that faces a center of the heat generating component, and a second surrounding portion that is formed outside the region of the first housing and surrounds the first surrounding portion.

Advantageous Effects of Invention

According to the present invention, it is possible to suppress outflow of the thermal conductive material while aligning the center of the crushed shape of the thermal conductive material with the center of the heat generating component. Problems, configurations, and effects other than those described above will become apparent by the following description of embodiments.

DESCRIPTION OF EMBODIMENTS

Hereinafter, a configuration and an operation of an in-vehicle device according to an embodiment of the present invention will be described with reference to the drawings. The present embodiment relates to an in-vehicle device mounted on a vehicle, such as an automated driving control device or an advanced driving assistance control device having a heat dissipation structure for dissipating heat generated from an electronic component such as a semiconductor element to the outside of a housing. The present embodiment has been made for the purpose of providing an in-vehicle device capable of improving applicability and cost by uniformly applying heat dissipation grease, and capable of suppressing deformation and outflow due to thermal deformation and vibration.

Figures 1, 2:
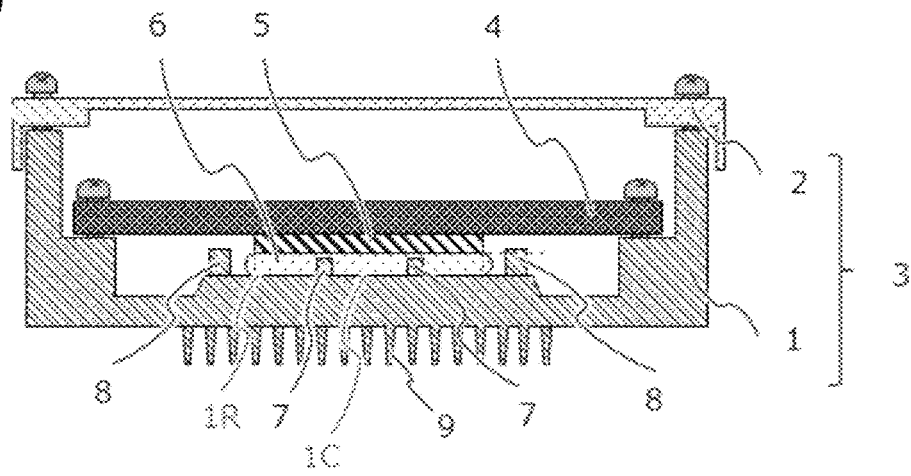
FIG. 1 is a cross-sectional view of an in-vehicle device.
FIG. 2 is an exploded view illustrating a heat dissipation structure.

As illustrated in FIG. 1, a housing 3 is formed by joining (fitting) a base member 1 and a cover member 2. An electronic component 5 is mounted on a circuit board 4 accommodated in the housing 3, and a thermal conductive material 6 fills a space between the electronic component 5 and the base member 1 facing the electronic component 5. In the present embodiment, the base member 1 facing the electronic component 5 includes a first surrounding portion 7 for forming the thermal conductive material 6 and a second surrounding portion 8 surrounding an outer periphery of the first surrounding portion 7.

It is preferable that a material of the base member 1 is metal because it is necessary to conduct, store, and dissipate heat from the electronic component 5, and a fin 9 for efficiently dissipating heat is provided on an outer side of the base member 1. Hereinafter, die-cast aluminum which is generally used as a material of the housing of the in-vehicle device will be described as an example.

A material of the cover member 2 does not need to be metal and may be resin as long as it does not particularly have a path for thermal conduction from the electronic component. The circuit board 4 may be in the form of a printed board, a flexible board, a ceramic board, or the like, and the present embodiment is effective in any case, but hereinafter, a printed board will be described as an example.

The base member 1 facing the electronic component 5 is provided with the first surrounding portion 7 having the electronic component 5 as the center and having a small size in a height direction, and the second surrounding portion 8 also having the electronic component 5 as the center along an outer side of an outer periphery of an outer shape of the component and having a large size in the height direction. Both the surrounding portions are integrated with the base member 1, and are formed by a die casting mold. In a case where the size of the first surrounding portion 7 in the height direction is increased, the effect of filling with the heat dissipation grease (thermal conductive material 6) can be obtained, but caution is required since a distance between the electronic component and the housing increases and thermal conduction deteriorates.

The first surrounding portion 7 and the second surrounding portion 8 need to be provided with an inclination for easily detaching the base member from the die casting mold after forming the base member by using the die casting mold. In the present embodiment, an inclination is provided in the first surrounding portion 7 in order to prevent air bubbles from entering the thermal conductive material 6, which will be described below in detail with reference to FIG. 8.

Figures 3, 4, 5A, 5B:
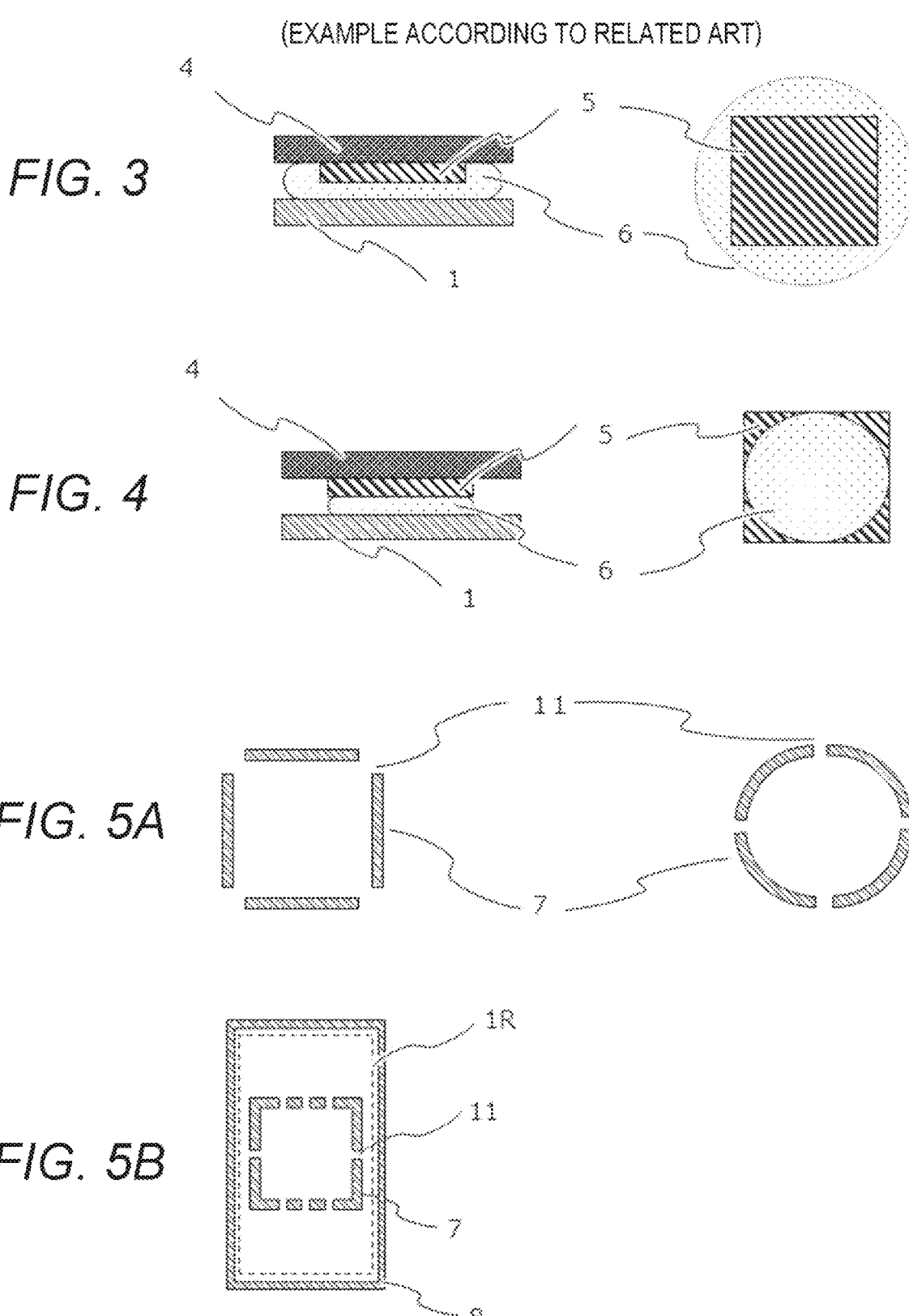
FIG. 3 is a cross-sectional view illustrating thermal conductive material application according to the related art.
FIG. 4 is a cross-sectional view illustrating ideal thermal conductive material application.
FIG. 5A is a top view of a first surrounding portion.
FIG. 5B is another top view of the first surrounding portion.

As illustrated in FIG. 5A, as an arrangement shape of the first surrounding portion 7, an optimum shape such as a quadrangle or a circle is selected depending on the material and shape of the electronic component 5, the material of the housing (base member 1), and a viscosity of the heat dissipation grease. An index for the selection is to prevent the heat dissipation grease from flowing out of the first surrounding portion 7 as much as possible until the inside of the first surrounding portion 7 is filled with the heat dissipation grease.

As for the arrangement shape of the first surrounding portion 7, the ease of flowing of the heat dissipation grease from the inside of the first surrounding portion 7 changes depending on a positional relationship with a groove 11 to be described below. In a case where the first surrounding portion 7 is arranged in such a way as to disperse a pressure of the heat dissipation grease flowing into the groove 11 from the inside of the first surrounding portion 7, the heat dissipation grease easily flows to the outside of the first surrounding portion 7. Hereinafter, a quadrangle will be described as the surrounding shape as an example.

Figure 6:
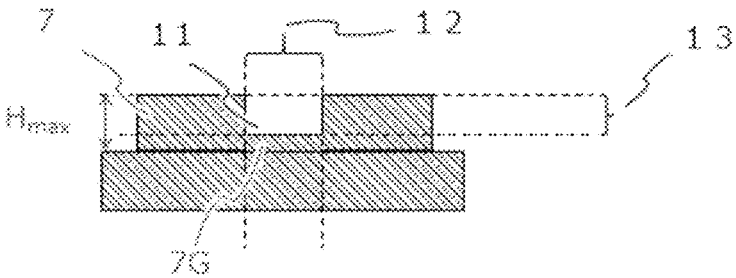
FIG. 6 is a side view of a groove provided in the first surrounding portion (the groove has a small height).
Figure 7:
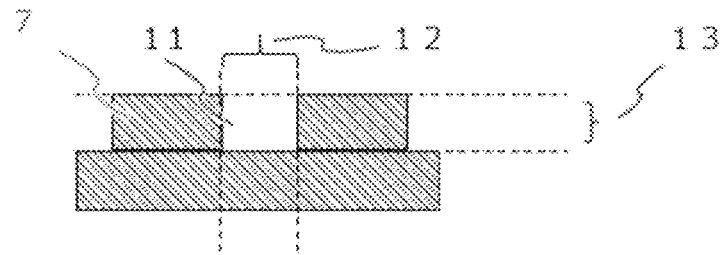
FIG. 7 is a side view of a groove provided in the first surrounding portion (the groove has a large height).

As illustrated in FIGS. 6 and 7, an optimum height of the groove 11 provided in the first surrounding portion 7 is selected depending on the material and shape of the electronic component 5, the material of the housing, and the viscosity of the heat dissipation grease. An index for the selection is to prevent the heat dissipation grease from flowing out of the first surrounding portion 7 as much as possible until the inside of the first surrounding portion 7 is filled with the heat dissipation grease. Since an increase in height 13 (depth) or width 12 of the groove 11 results in an increase in area of the groove 11, the volume of the heat dissipation grease flowing out of the first surrounding portion 7 through the groove 11 increases as much as possible, and the heat dissipation grease easily flows out of the first surrounding portion 7. Hereinafter, a case where the groove portion has the maximum height will be described as an example.

The optimum number of grooves 11 (groove portions) to be provided in the first surrounding portion 7 is also selected depending on the material of the housing and the viscosity of the heat dissipation grease. An index for the selection is to prevent the heat dissipation grease from flowing out of the first surrounding portion 7 as much as possible until the inside of the first surrounding portion 7 is filled with the heat dissipation grease. An increase in number of grooves 11 results in dispersion of the pressure of the heat dissipation grease flowing into the groove 11 from the inside of the first surrounding portion 7, so that the heat dissipation grease easily flows to the outside of the first surrounding portion 7. Hereinafter, an example in which the number of the grooves 11 of the first surrounding portion 7 is four will be described.

The in-vehicle device is assembled in the following order to form a crushed shape of the heat dissipation grease.

(1). The electronic component 5 is mounted on the circuit board 4.

(2). An inner side of the base member 1 is directed vertically upward, the coordinates of a nozzle are aligned with the center of the first surrounding portion 7, and the heat dissipation grease is applied.

(3). A mounting surface of the electronic component 5 of (1) is directed vertically downward (toward the heat dissipation grease), and is combined with (2).

(4). The circuit board 4 is fixed to the base member 1 with screws.

(5). The cover member 2 is fixed to the base member 1 with screws.

Effects of Present Embodiment

The first surrounding portion 7 has an effect of correcting the center of the crushed shape of the heat dissipation grease in such a way as to be aligned with the center of the component when the application position of the heat dissipation grease is shifted from the center of the component.

Figure 10:
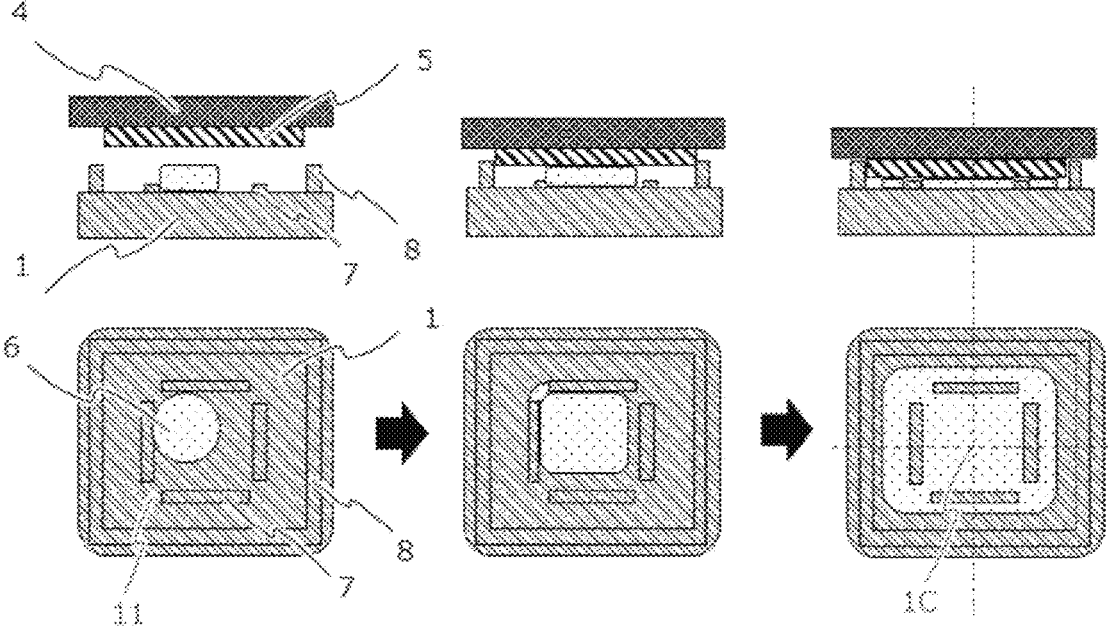
FIG. 10 is a state change view of a crushed shape of a thermal conductive material to which the present invention is applied.

As illustrated in FIG. 10, by using the first surrounding portion 7, the inside of the first surrounding portion 7 can be first filled with the heat dissipation grease in a process of forming the crushed shape of the heat dissipation grease (thermal conductive material 6). Thereafter, the center of the crushed shape of the heat dissipation grease can be corrected in such a way as to be aligned with the center of the component by applying and spreading the heat dissipation grease to the outside through the grooves 11 provided at various places of the first surrounding portion 7.

Since the crushed shape of the heat dissipation grease varies depending on the material and shape of the electronic component, the material of the housing, and the viscosity of the heat dissipation grease, it is necessary to optimize the shape of the first surrounding portion 7 depending on a material of a component of a product. The crushed shape of the heat dissipation grease can be optimized by adjusting the arrangement shape (FIG. 5A) and the height of the first surrounding portion 7, and the height (FIGS. 6 and 7) and the number of grooves.

However, in a case where the size of the first surrounding portion 7 in the height direction is increased, the effect of filling with the heat dissipation grease can be obtained, but caution is required since a distance between the electronic component and the housing increases and thermal conduction deteriorates.

By accurately forming the crushed shape of the heat dissipation grease at the center of the component by the above-described effect, a path for efficient thermal conduction is formed around the electronic component 5 (FIG. 4), and the cost of the heat dissipation grease can be reduced.

As illustrated in FIG. 3, according to the related art, the heat dissipation grease is applied excessively in consideration of the fact that the crushed shape of the heat dissipation grease is shifted from the center, and as a result of which the excessive heat dissipation grease is crushed and overflows to the outside of the electronic component 5. Since the space between the electronic component 5 and the housing (base member 1) is not filled with the heat dissipation grease, the thermal conduction effect of the heat dissipation grease cannot be obtained.

The second surrounding portion 8 has an effect of preventing the heat dissipation grease from overflowing to the outside of the outer shape of the electronic component 5. As described above, when the heat dissipation grease overflows to the outside of the electronic component 5, the thermal conduction effect of the heat dissipation grease cannot be obtained. Therefore, the second surrounding portion 8 prevents the heat dissipation grease from overflowing to the outside in the process of forming the crushed shape of the heat dissipation grease.

In addition, the heat dissipation grease easily loses its shape due to thermal deformation or vibration, and easily flows out from the outer shape of the electronic component 5 to the outside. In order to prevent the loss of the shape and the outflow of the heat dissipation grease, the second surrounding portion 8 can surround the heat dissipation grease to prevent the loss of shape and the outflow of the heat dissipation grease.

Figure 8:
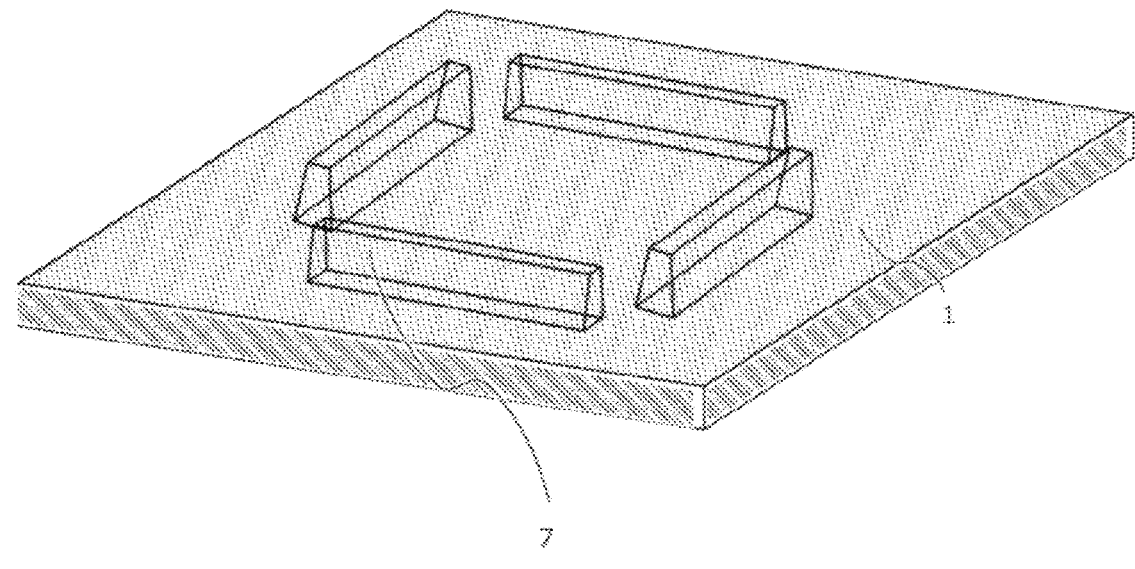
FIG. 8 illustrates an inclination of the first surrounding portion.
Figure 9:
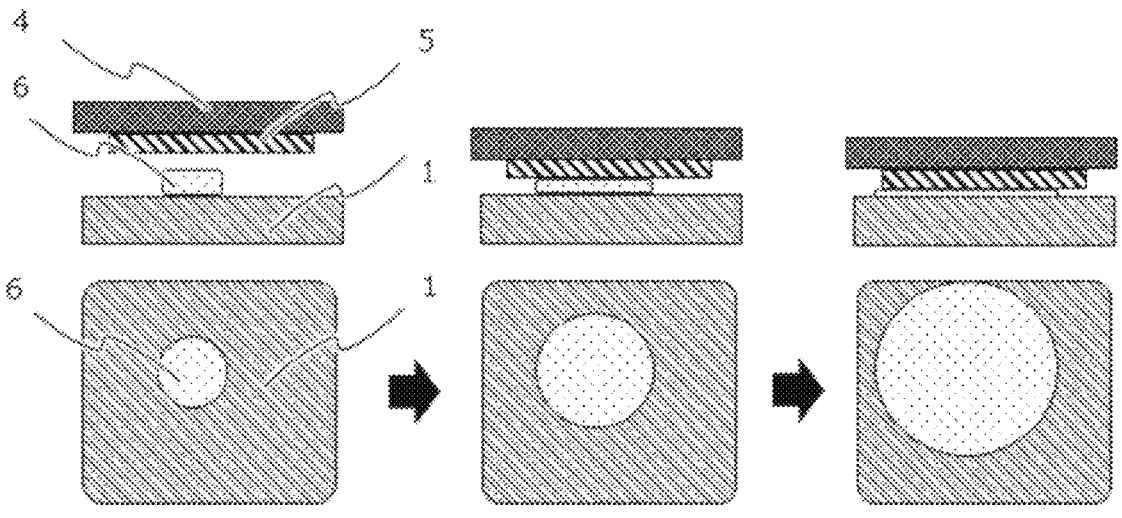
FIG. 9 is a state change view of a crushed shape of a thermal conductive material according to the related art.

The inclination (FIG. 8) provided in the first surrounding portion 7 has an effect of preventing air bubbles from being mixed between the housing and the heat dissipation grease. By providing the first surrounding portion 7, air bubbles are mixed between the electronic component and the heat dissipation grease in a process of crushing the heat dissipation grease. Since the air bubbles reduce a ground contact area (contact area) between the housing and the heat dissipation grease, thermal conduction between the housing and the heat dissipation grease is hindered. In order to prevent the air bubbles from being mixed, it is necessary to provide the inclination as illustrated in FIG. 8 in the first surrounding portion 7.

Since the inclination of the first surrounding portion 7 described above is also a measure (not providing a right angle portion) for easily detaching the base member from the die casting mold after forming the base member 1 by using the die casting mold, a certain degree of inclination is necessarily required. However, an inclination angle of the first surrounding portion 7 needs to be optimized in consideration of the material and shape of the electronic component 5, the material of the housing, and the viscosity of the heat dissipation grease.

The characteristics of the present embodiment can also be summarized as follows.

As illustrated in FIG. 1, the in-vehicle device includes the circuit board 4 on which the heat generating component (electronic component 5) is mounted, a first housing (base member 1) that faces the heat generating component (electronic component 5), and the thermal conductive material 6 that fills a space between the heat generating component (electronic component 5) and the first housing (base member 1). The first housing (base member 1) includes the first surrounding portion 7 and the second surrounding portion 8. The first surrounding portion 7 is formed inside a region 1R (an orthographic projection in FIG. 5B) of the first housing (base member 1) that overlaps with the heat generating component (electronic component 5) while having the thermal conductive material 6 interposed therebetween, and surrounds a point 1C in the region 1R of the first housing (base member 1) that faces the center of the heat generating component (electronic component 5). The second surrounding portion 8 is formed outside the region 1R of the first housing (base member 1) and surrounds the first surrounding portion 7.

With the first surrounding portion 7, the thermal conductive material 6 applied to the inside of the first surrounding portion 7 is first applied and spread inside the first surrounding portion 7, and then applied and spread to the outside the first surrounding portion 7. As a result, the center of the crushed shape of the thermal conductive material 6 is guided to the point 1C facing the center of the heat generating component (electronic component 5) (FIG. 10). In addition, the second surrounding portion 8 prevents the thermal conductive material 6 from flowing out.

As illustrated in FIG. 5A, the first surrounding portion 7 has at least one groove 11. The groove 11 can adjust ease of outflow of the thermal conductive material 6 to the outside of the first surrounding portion 7. The groove 11 is formed by, for example, molding, and may also be formed by another method such as cutting.

In the example of FIG. 5B, the heat generating component (electronic component 5) has a rectangular shape with respect to a surface of the circuit board 4 (a surface on which the electronic component 5 is mounted). The number of grooves 11 facing a short side of the heat generating component (electronic component 5) may be larger than the number of grooves 11 facing a long side of the heat generating component (electronic component 5). Alternatively, a depth dimension of the groove 11 facing a short side of the heat generating component (electronic component 5) may be larger than a depth dimension of the groove 11 facing a long side of the heat generating component (electronic component 5). By adjusting the number or depth dimension of the grooves 11 according to the shape of the heat generating component (electronic component 5), the thermal conductive material 6 uniformly fills a space between the heat generating component (electronic component 5) and the first housing (base member 1).

As illustrated in FIG. 6, the depth dimension (height 13) of the groove 11 is smaller than a maximum value Hmax of the height dimension of the first surrounding portion 7. In other words, the first housing (base member 1) includes a gate 7G that adjusts (reduces) an opening area of the groove 11. As a result, a flow rate of the thermal conductive material 6 flowing out from the groove 11 can be suppressed.

As illustrated in FIG. 1, an inner wall of the second surrounding portion 8 is positioned outside a side surface of the heat generating component (electronic component 5). A height dimension of the second surrounding portion 8 is larger than a height dimension of the first surrounding portion 7. Specifically, an upper end of the second surrounding portion 8 is positioned between a surface of the heat generating component (electronic component 5) that faces the first housing (base member 1) and a surface of the circuit board 4 that faces the first housing (base member 1). Accordingly, it is possible to prevent the thermal conductive material 6 from flowing out over the second surrounding portion 8.

A second housing (cover member 2) is fitted to the first housing (base member 1) and covers the circuit board 4. Accordingly, it is possible to protect the circuit board 4 on which the electronic component 5 is mounted.

As illustrated in FIG. 5A, the first surrounding portion 7 has, for example, a quadrangular shape or a circular shape, and may also have a polygonal shape. In the example of FIG. 2, the first surrounding portion 7 and the second surrounding portion 8 are disposed in such a way as to be parallel to each side of the heat generating component (electronic component 5). As a result, the crushed shape of the thermal conductive material 6 can be formed. In the circular first surrounding portion 7, since the flow of the thermal conductive material 6 is not concentrated in the groove 11, the thermal conductive material 6 is less likely to flow out of the groove 11 than in the quadrangular first surrounding portion 7.

As illustrated in FIG. 8, the first surrounding portion 7 has the inclination for preventing air bubbles from entering the thermal conductive material 6. Accordingly, it is possible to prevent hindering of thermal conduction due to air bubbles.

As described above, according to the present embodiment, it is possible to suppress outflow of the thermal conductive material while aligning the center of the crushed shape of the thermal conductive material with the center of the heat generating component.

Note that the present invention is not limited to the embodiments described above, but includes various modified examples. For example, the above-described embodiments have been described in detail in order to explain the present invention in an easy-to-understand manner, and the present invention is not necessarily limited to those having all the configurations described. Further, a part of a configuration of an embodiment can be replaced with a configuration of another embodiment, and a configuration of an embodiment can be added with a configuration of another embodiment. In addition, a part of the configuration of each embodiment can be added with another configuration, can be deleted, and can be replaced with another configuration.

The embodiments of the present invention may have the following aspects.

(1). The in-vehicle device including: the circuit board 4 on which the heat generating component (electronic component 5) is mounted; and a circuit board housing including the base member 1 that houses the circuit board 4 and the cover member 2, in which a heat transfer portion (protrusion) that dissipates heat of the circuit board 4 is provided at a portion facing the heat generating component on an inner side of the base member 1, a heat dissipation member (thermal conductive material 6) fills a space between the heat transfer portion and the heat generating component, and the heat transfer portion includes the first surrounding portion 7 protruding toward the heat generating component and formed to surround a first region including the center of the heat generating component, and the second surrounding portion 8 surrounding the outer periphery of the first surrounding portion.

(2). The in-vehicle device according to (1), in which the first surrounding portion 7 has at least one groove portion (groove 11).

(3). The in-vehicle device according to (2), in which the groove portion of the first surrounding portion 7 has a smaller height dimension than that of a portion having the largest height dimension in the first surrounding portion 7.

(4). The in-vehicle device according to (2), in which the second surrounding portion 8 is formed on an outer peripheral side of the heat generating component.

(5). The in-vehicle device according to (2), in which a height dimension of the second surrounding portion 8 is larger than a height dimension of the first surrounding portion 7.

(6). The in-vehicle device according to (2), in which the first surrounding portion 7 has a polygonal shape.

(7). The in-vehicle device according to (5), in which the first surrounding portion 7 has a quadrangular shape.

(8). The in-vehicle device according to (6), in which both the first surrounding portion 7 and the second surrounding portion 8 are arranged in such a way as to be parallel to each side of the heat generating component.

(9). The in-vehicle device according to (4), in which the first surrounding portion 7 has a circular shape.

(10). The in-vehicle device according to (1), in which the first surrounding portion 7 has a triangular prism shape, and is arranged in such a way as to increase in volume from a heat generating component (electronic component 5) side to a heat transfer portion side.

By providing the surrounding portion for molding the crushed shape in the housing on the base side to which the thermal conductive material is applied, the application work can be improved.

REFERENCE SIGNS LIST

1 base member
2 cover member
3 housing
4 circuit board
5 electronic component
6 thermal conductive material
7 first surrounding portion
8 second surrounding portion
9 fin
11 groove

The invention claimed is:

1. An in-vehicle device comprising:
a circuit board on which a heat generating component is mounted;
a first housing that faces the heat generating component; and
a thermal conductive material that fills a space between the heat generating component and the first housing, wherein the first housing includes a first surrounding portion that is formed inside a region of the first housing that overlaps with the heat generating component while having the thermal conductive material interposed therebetween and surrounds a point in the region of the first housing that faces a center of the heat generating component, wherein the first surrounding portion comprises at least one groove extending through the first surrounding portion to allow controlled outflow of excess thermal conductive material of the thermal conductive material from an inner side of the first surrounding portion to an outer side of the first surrounding portion during assembly and is configured to control the excess thermal conductive material outward during the assembly while maintaining the thermal conductive material centered over the heat generated component, and wherein a second surrounding portion that is formed outside the region of the first housing and surrounds the first surrounding portion, wherein a depth dimension of the at least one groove is smaller than a maximum value of a height dimension of the first surrounding portion.

2. The in-vehicle device according to claim 1, wherein an inner wall of the second surrounding portion is positioned outside a side surface of the heat generating component.

3. The in-vehicle device according to claim 2, wherein an upper end of the second surrounding portion is positioned between a surface of the heat generating component that faces the first housing and a surface of the circuit board that faces the first housing.

4. The in-vehicle device according to claim 1, wherein a height dimension of the second surrounding portion is larger than a height dimension of the first surrounding portion.

5. The in-vehicle device according to claim 1, wherein the first surrounding portion has a polygonal shape.

6. The in-vehicle device according to claim 5, wherein the first surrounding portion has a quadrangular shape.

7. The in-vehicle device according to claim 5, wherein the first surrounding portion and the second surrounding portion are arranged in such a way to be parallel to each side of the heat generating component.

8. The in-vehicle device according to claim 1, wherein the first surrounding portion has a circular shape.

9. The in-vehicle device according to claim 1, wherein the first housing includes a gate that adjusts an opening area of the at least one groove.

10. The in-vehicle device according to claim 1, wherein the heat generating component has a rectangular shape with respect to a surface of the circuit board, and a number of grooves facing a short side of the heat generating component is larger than a number of grooves facing a long side of the heat generating component.

11. The in-vehicle device according to claim 1, wherein the heat generating component has a rectangular shape with respect to a surface of the circuit board, and a depth dimension of the at least one groove facing a short side of the heat generating component is larger than a depth dimension of the at least one groove facing a long side of the heat generating component.

12. The in-vehicle device according to claim 1, wherein the first surrounding portion has an inclination for preventing air bubbles from entering the thermal conductive material.

13. The in-vehicle device according to claim 1, further comprising a second housing that is fitted to the first housing and covers the circuit board.

14. The in-vehicle device according to claim 1, wherein the at least one groove is configured to guide excess thermal conductive material outward during assembly to reduce void formation at an interface between the heat generating component and the first housing.

15. The in-vehicle device according to claim 1, wherein the at least one groove is configured to allow a crushed shape of the thermal conductive material in an X-Y plane of the in-vehicle device.

16. The in-vehicle device according to claim 1, wherein the first surrounding portion is positioned between the heat generating component and the second surrounding portion and is spaced apart from the second surrounding portion to define a space therebetween.

17. The in-vehicle device according to claim 1, wherein the first surrounding portion has an inclination configured to prevent air bubbles from entering the thermal conductive material by providing a sloped surface that guides a flow of the thermal conductive material and eliminates air entrapment during assembly.

18. The in-vehicle device according to claim 1, wherein the at least one groove comprises a gate structure that reduces an opening area of the groove to control a flow rate of the thermal conductive material flowing through the groove, wherein a depth dimension of the groove is smaller than a maximum value of a height dimension of the first surrounding portion to create the gate structure.

* * * * *